United States Patent [19]
Furuyama et al.

[11] Patent Number: 5,787,046
[45] Date of Patent: Jul. 28, 1998

[54] SEMICONDUCTOR MEMORY DEVICE PROVIDED WITH BLOCK WRITE FUNCTION

[75] Inventors: Takaaki Furuyama; Akira Sugiura, both of Kasugai, Japan

[73] Assignee: Fujitsu Limited, Kanagawa, Japan

[21] Appl. No.: 636,801

[22] Filed: Apr. 23, 1996

[30] Foreign Application Priority Data

Aug. 8, 1995 [JP] Japan ................................ 7-202319

[51] Int. Cl.$^6$ .................................................... G11C 13/00
[52] U.S. Cl. ......................... 365/230.03; 365/230.01
[58] Field of Search ..................... 365/189.01, 230.01, 365/189.04, 230.03

[56] References Cited

U.S. PATENT DOCUMENTS

| | | | |
|---|---|---|---|
| 5,274,596 | 12/1993 | Watanabe | 365/230.03 |
| 5,430,672 | 7/1995 | Kuwabara et al. | 365/149 |

*Primary Examiner*—Terrell W. Fears
*Attorney, Agent, or Firm*—Armstrong, Westerman, Hattori, McLeland & Naughton

[57] ABSTRACT

A semiconductor memory device is operable in an operation mode selected from a read mode, a normal write mode and a block write mode. The memory device includes a memory cell array having a plurality of pairs of bit lines, a plurality of word lines and a plurality of memory cells provided at intersections of the bit lines and the word lines, wherein each pair of the bit lines and the memory cells associated with each bit line pair form one of a plurality of columns defined in the memory cell array. The memory device also includes a pair of data lines and a column selection controller, wherein the column selection controller is supplied with a group of column selection signals for selectively connecting and disconnecting the pair of data lines to and from the plurality of pairs of bit lines. In response to the group of column selection signals with a first signal output pattern for use in the normal write mode or the read mode, the column selection controller selects one of the plurality of columns to connect the pair of data lines to a pair of bit lines associated with the select column. Further, in response to the group of column selection signals with a second signal output pattern for use in the block write mode, the column selection controller selects at least two of the plurality of columns to connect the pair of data lines to the bit line pairs associated with a column block as a group of the selected columns.

7 Claims, 11 Drawing Sheets

SEMICONDUCTOR MEMORY DEVICE PROVIDED WITH BLOCK WRITE FUNCTION

BACKGROUND OF THE INVENTION

1. Field of the Invention

The present invention relates generally to an image memory device which is a type of semiconductor memory device having a block write function for writing the same data in a block comprising a plurality of columns. More particularly, the present invention is directed to decrease the circuit area and reduce power consumption in the image memory device.

2. Description of the Related Art

Image memory devices are used, for example, to store image data to be displayed on a graphic display unit. To efficiently paint out a display screen or simultaneously clear displayed data, the image memory device is provided with a block write function for writing the same data (logic 0 or 1) in a block comprising a plurality of columns. FIG. 1 is a diagram showing a part of a conventional image memory device provided with a block write function. The image memory device includes a VRAM (video random access memory) and an SGRAM (synchronous graphic random access memory). An image memory is provided with a memory cell array having a plurality of bit line pairs (BL./BL), a plurality of word lines WL, and a memory cell C arranged at the intersection between each bit line and each word line. A sense amplifier to be activated by the supply of a high-potential power supply PSA and a low-potential power supply NSA is connected between each pair of bit lines (BL./BL). A column gate Tg comprising an N-channel MOS transistor is connected between each pair of bit lines (BL./BL) and eight data bus pairs (DB0./DB0 to DB7./DB7), respectively. Sixteen column gates Tg connected to the eight data bus pairs (DB0./DB0 to DB7./DB7) serve as one block. The column gates Tg of each block are selectively activated by block selection signals CL0 to CLn. Thereby, bit line pairs (BL./BL) corresponding to eight consecutive columns are connected to eight data bus pairs (DB0./DB0 to DB7./DB7) by sixteen column gates Tg.

The image memory is further provided a with column decoder (not shown) for generating block selection signals CL0 to CLn any one of which is H-level in accordance with column address signals of remaining bits except the low-order three bits. In the normal write and read modes, a gate circuit (not shown) selects any one of the data bus pairs (DB0./DB0 to DB7./DB7) in accordance with a column address signal of the low-order three bits. A selected data bus pair is connected to read and write circuits (not shown). Thus, data is written in or read from the memory cell C associated with the bit line pair (BL./BL) connected to the selected data bus pair and one word line WL.

When eight data bus pairs (DB0./DB0 to DB7./DB7) are simultaneously selected by the gate circuit in the block write mode, the write circuit supplies the same write data signal to each data bus pair. The same write data signal is supplied to eight bit line pairs (BL./BL) through sixteen column gates Tg activated by one of the block selection signals CL0 to CLn. Thus, the write data signal is amplified by each sense amplifier SA and simultaneously written in eight memory cells C associated with a selected word line WL. Therefore, because the same data is written in eight columns, eight data bus pairs are necessary. This causes the circuit area of an image memory to increase. Increase in the number of columns in which the same data is written brings about increase in the number of data bus pairs. Consequently, the circuit area is further increased.

FIG. 2 shows a flip-flop-type sense amplifier SA. In the read mode, the sense amplifier SA increases a potential difference produced between bit line pairs (BL./BL) due to a cell data signal read from the memory cell C and supplies the amplified potential difference to the data bus pair (DB./DB) as a read data signal. In the write mode, the sense amplifier SA amplifies the write data supplied from a write amplifier WA through the data bus pair (DB./DB) and supplies it to the bit line pair (BL./BL). Thus, the data signal is written in a selected memory cell C.

The SGRAM performs write masking in the block write mode. In the case of the write masking, the same data is not written in a predetermined specific memory cell in order to maintain the data stored in the specific memory cell. The write masking includes the write-per-bit, column-masking, and DQM-masking methods. The write-per-bit method performs selective write masking of the data stored in each memory cell in a memory array in accordance with the write masking data. The write masking data is supplied to each input terminal in an SGRAM having a plurality of input/output terminals. In the case of the write-per-bit method in an SGRAM having a plurality of memory cell arrays, write masking is performed for each memory cell array. The column masking method, for example, performs write masking of the data stored in each memory cell corresponding to any column in eight columns. The DQM masking method, for example, selectively performs write masking for each group by assuming eight input/output terminals DQ as one group.

FIG. 3 is a diagram showing the write-per-bit method in an SGRAM of 32-bit type. Mask data is written in a mask register 1 through 32 input/output terminals DQ0 to DQ31. Data to be written in each memory cell, in a memory cell array 2, is selected from write data Din to be supplied to the terminals DQ0 to DQ31. The data Din corresponding to mask data "1" is written in each memory cell but the write data Din corresponding to mask data "0" is not written in it. In the case of write masking according to the write-per-bit method, the data bus pairs (DB0./DB0 to DB7./DB7) are kept H-level in order to regulate data write when mask data is "0".

FIG. 4 is a diagram showing the column masking method. Color data values CR0 to CR7 serving as write data are stored in a color register 3. In accordance with mask data CM, color data is selectively written in the memory cells of eight columns. When the mask data CM is "1", the color data values CR0 to CR7 are respectively written in the memory cells of eight columns. When the mask data CM is "0", the color data values CR0 to CR7 are not written in the memory cells of eight columns. This column masking method, the data bus pairs (DB0./DB0 to DB7./DB7) associated with a column to be write-masked are kept H-level in order to regulate data write when mask data is "2".

FIG. 5 is a diagram showing a method using the write-per-bit and column-masking methods together. First mask data for write-per-bit is stored in a mask register 1. The color data values CR0 to CR7 to be supplied to the input/output terminals DQ0 to DQ7 are selectively written in each memory cell in accordance with the first mask data and second mask data CM for column masking.

In the block write mode, the sense amplifier SA of each column amplifies a cell data signal to be written in each memory cell associated with a selected word line WL. Thus, one of the bit line pair (BL./BL) becomes H-level and the other of the pair becomes L-level. Under the above state, a write amplifier applies an H-level voltage to the data bus pairs (DB0./DB0 to DB7./DB7) associated with a column to be write-masked. At this time, as shown in FIG. 2, a penetration current I (shown by a dotted line) flows from the write amplifier WA to the sense amplifier SA through one of the data bus pair and one of the bit line pair. That is, the current I flows to the N-channel MOS transistor for outputting L-level voltage in the sense amplifier SA. This increases power consumption.

The SGRAM has a plurality of redundant columns in addition to the normal columns described above. If there is even one defective cell in the memory cells of eight normal columns, the eight normal columns are changed to eight redundant columns. Therefore, one redundant system comprises eight redundant columns. This increases the circuit area of the SGRAM having a plurality of redundant systems.

SUMMARY OF THE INVENTION

Broadly speaking, the present invention relates to a semiconductor memory device for decreasing a circuit area and reducing power consumption.

A semiconductor memory device is operable in an operation mode selected from a read mode, a normal write mode and a block write mode. The memory device includes a memory cell array having a plurality of pairs of bit lines, a plurality of word lines and a plurality of memory cells provided at intersections of the bit lines and the word lines, wherein each pair of the bit lines and the memory cells associated with each bit line pair form one of a plurality of columns defined in the memory cell array. The memory device also includes a pair of data lines and a column selection controller, wherein the column selection controller is supplied with a group of column selection signals for selectively connecting and disconnecting the pair of data lines to and from the plurality of pairs of bit lines. In response to the group of column selection signals with a first signal output pattern for use in the normal write mode or the read mode, the column selection controller selects one of the plurality of columns to connect the pair of data lines to a pair of bit lines associated with the select column. Further, in response to the group of column selection signals with a second signal output pattern for use in the block write mode, the column selection controller selects at least two of the plurality of columns to connect the pair of data lines to the bit line pairs associated with a column block as a group of the selected columns.

Furthermore, the column selection controller of the semiconductor memory device is supplied with a write mask signal which is used for invalidating at least one of the selected columns of the column block. Additionally, the column selection controller selectively invalidates the group of column selection signals with the second signal output pattern in response to the write mask signal.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings.

FIGS. 6 through 15 illustrate one embodiment of this invention, in which:

FIG. 6 is a basic block diagram of the embodiment of this invention;

FIG. 7 is a block diagram showing the SGRAM;

FIG. 8 is a block diagram showing a bank of the SGRAM;

FIG. 9 is a circuit diagram showing a column selection controller in a bank;

FIG. 10 is a waveform diagram showing each signal associated with normal read operation;

FIG. 11 is a waveform diagram showing each signal associated with normal write operation and write masking in block write;

FIG. 12 is a circuit diagram showing the first predecoder included in a column decoder in a bank;

FIG. 13 is a circuit diagram showing the first switching circuit of the first predecoder;

FIG. 14 is a circuit diagram showing the second switching circuit of the first predecoder; and FIG. 15 is a circuit diagram showing the third switching circuit of the first predecoder.

DETAILED DESCRIPTION OF THE PREFERRED EMBODIMENTS

Figure 1:
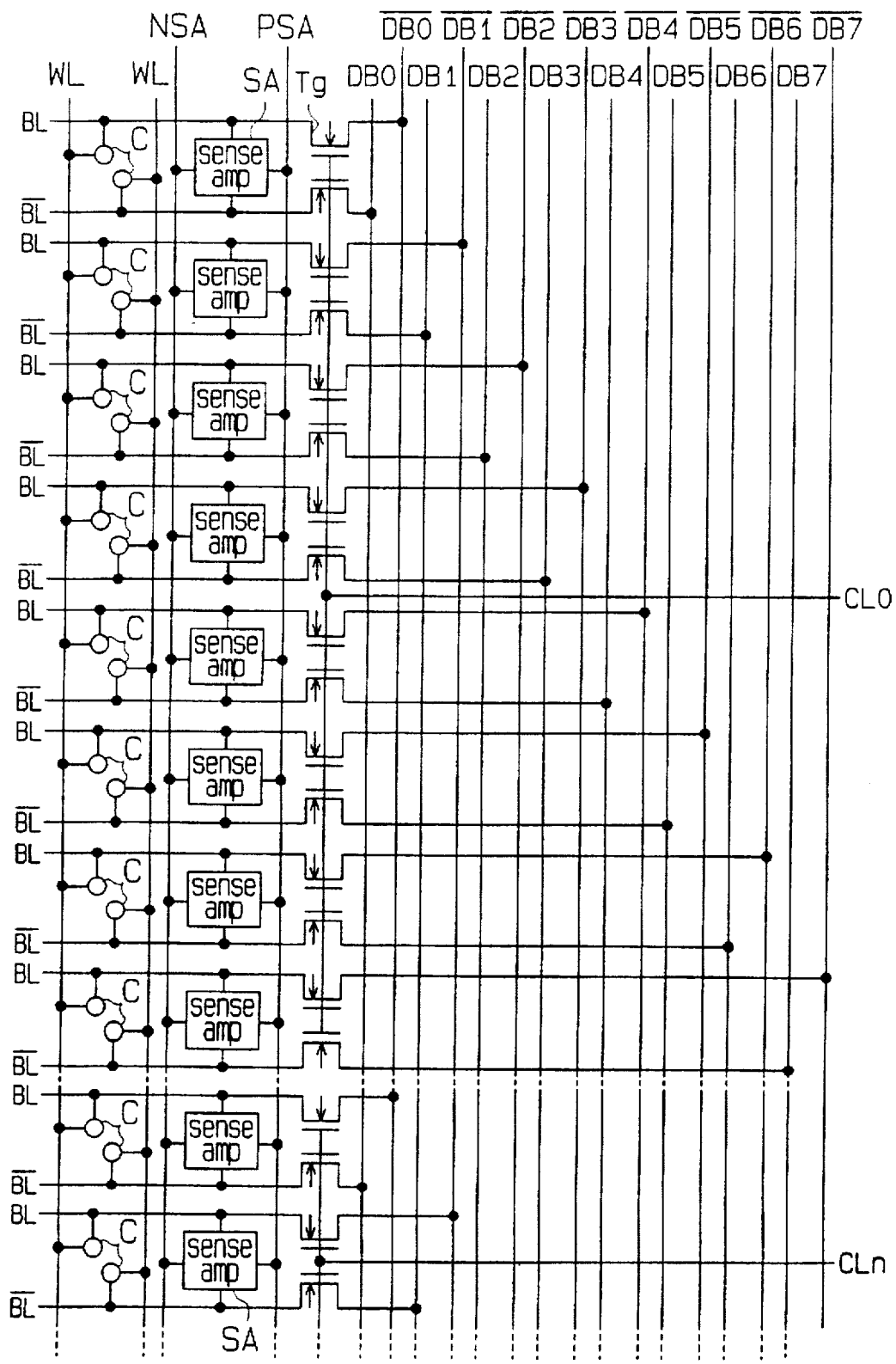
FIG. 1 is a circuit diagram showing a conventional column selection controller and memory cell array.
Figure 2:
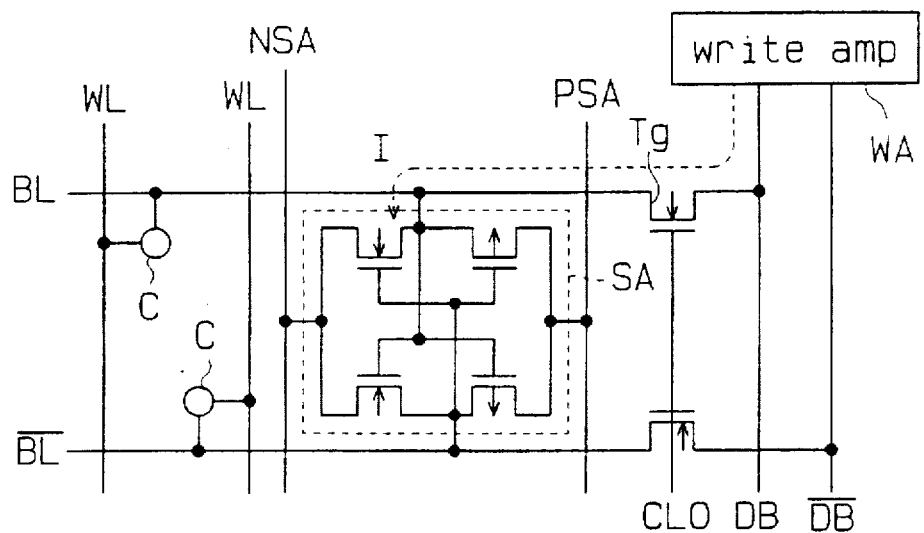
FIG. 2 is a circuit diagram showing a sense amplifier.
Figure 3:
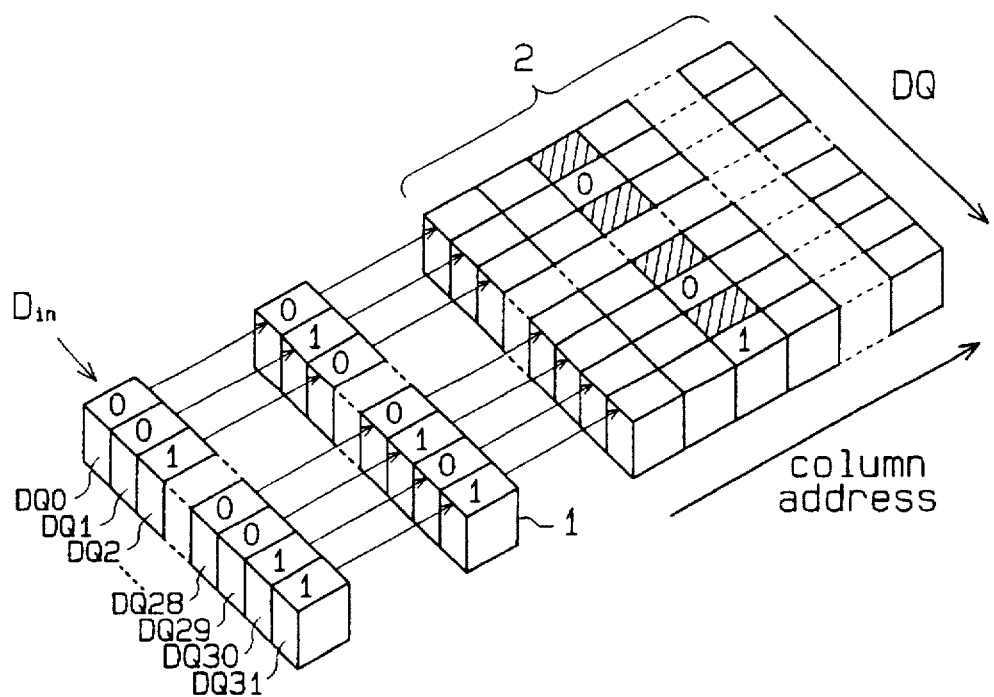
FIG. 3 is a conceptual view showing write masking according to the write-per-bit method.
Figure 4:
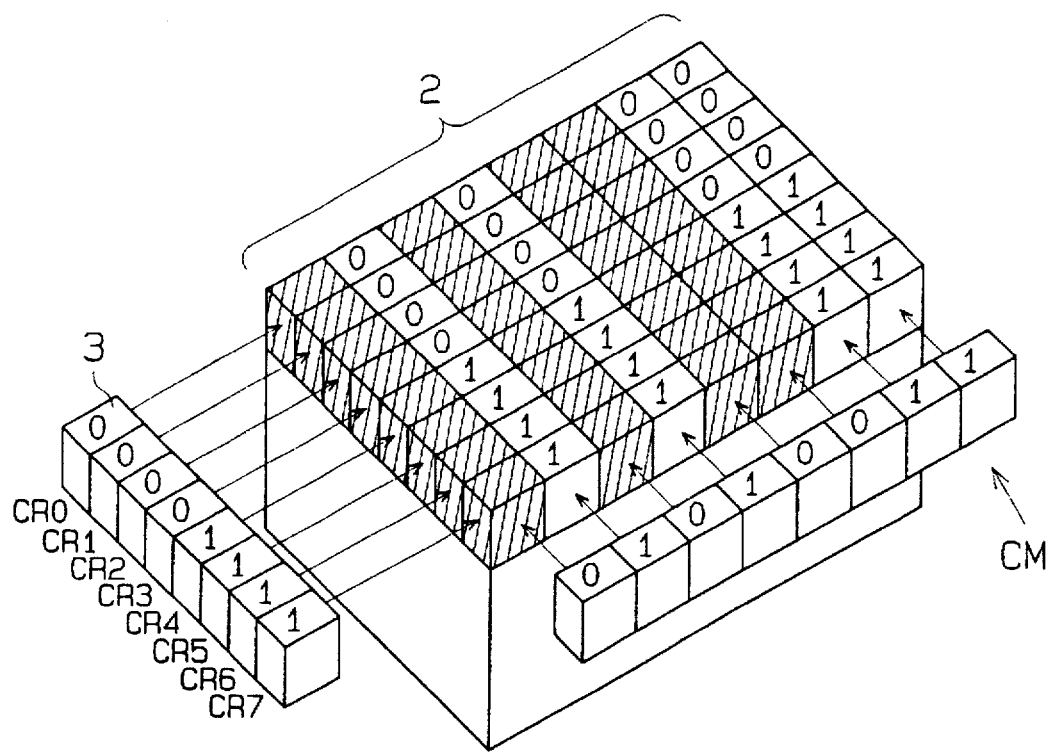
FIG. 4 is a conceptual diagram showing write masking according to the column masking method.
Figure 5:
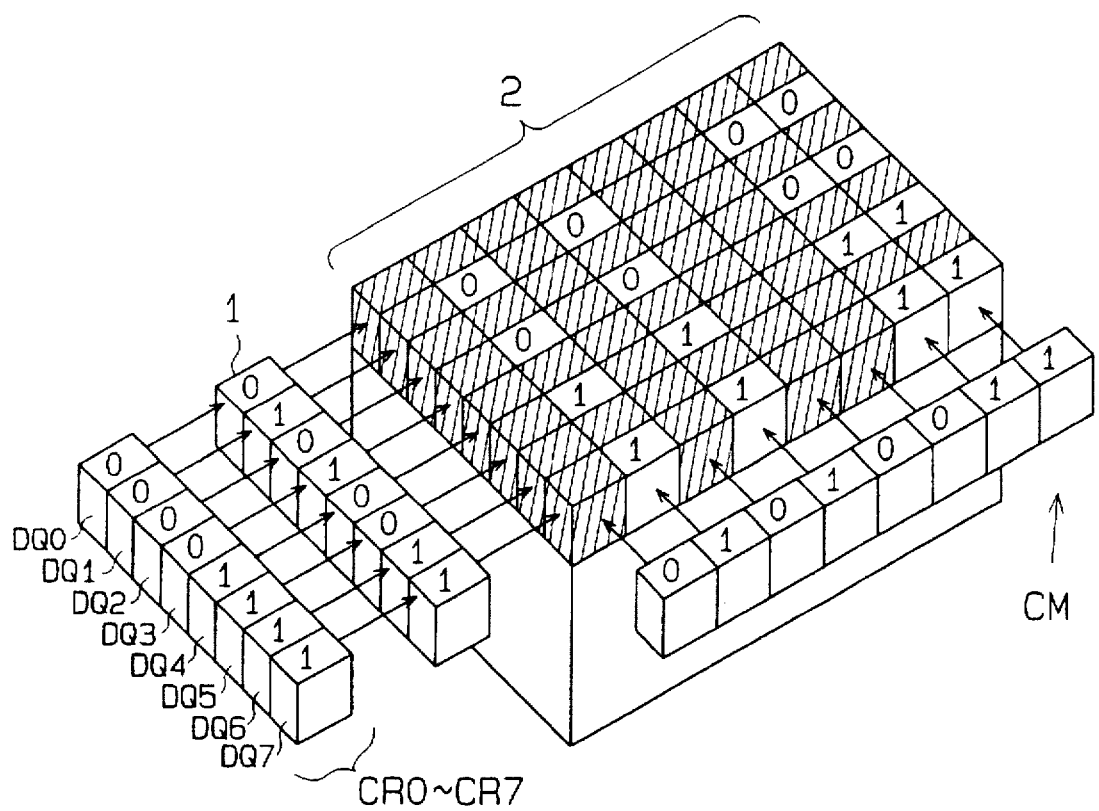
FIG. 5 is a conceptual diagram showing write masking according to a method using the write-per-bit and column-masking methods together.
Figure 6:
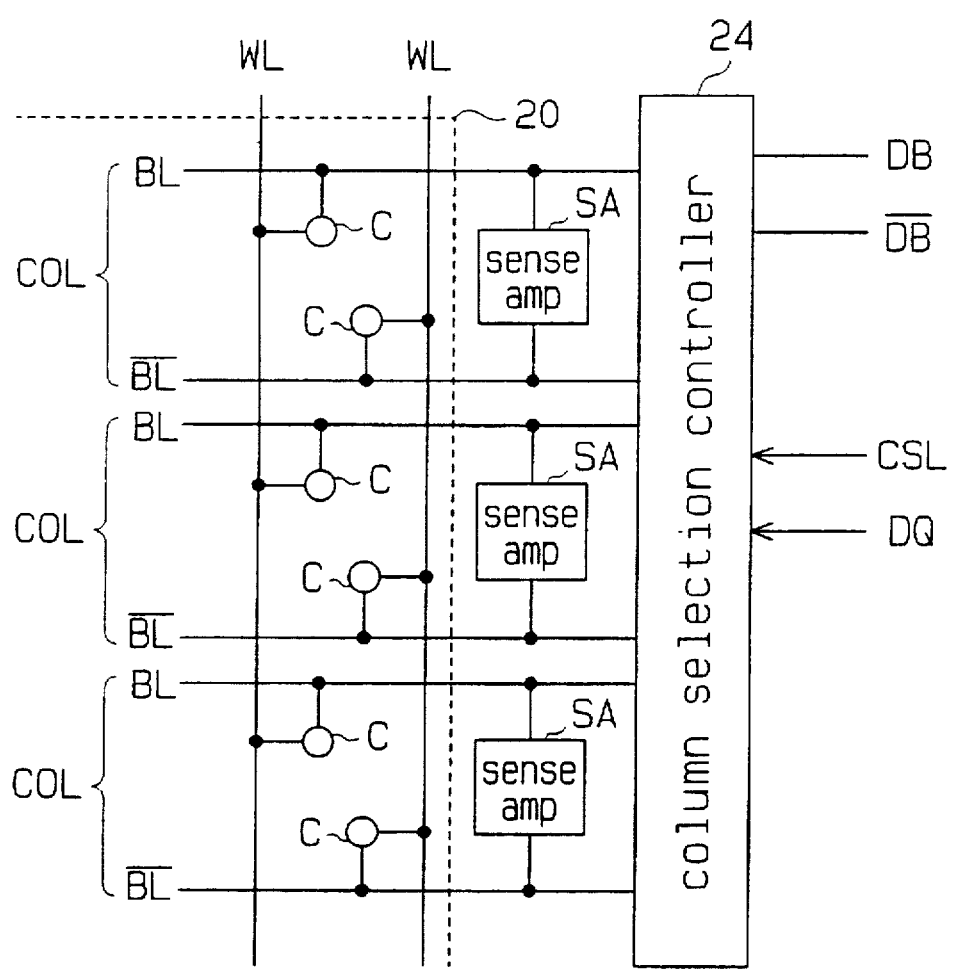

The semiconductor memory device of an embodiment of the present invention is described below by referring to the accompanying drawings. FIG. 6 is a basic diagram of this embodiment. The embodiment pertains to a semiconductor memory device includes a memory cell array 20 and column selection controller 24. The structure and operation of the column selection controller 24 is discussed in detail below.

Figure 7:
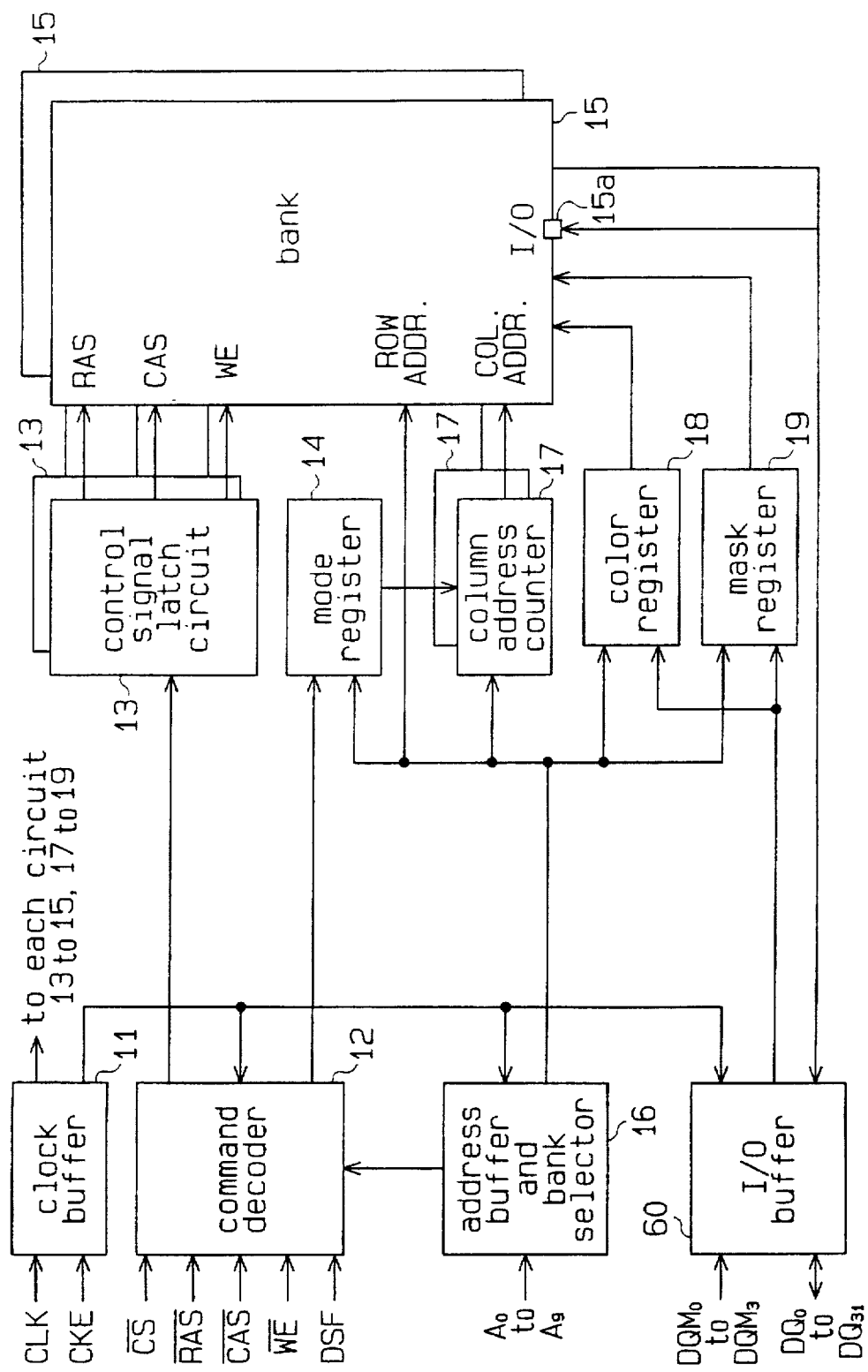

This embodiment is constituted by applying the present invention to an SGRAM (synchronous graphic random access memory) shown in FIG. 7. The SGRAM is provided with a clock buffer 11, a command decoder 12, a plurality of control signal latch circuits 13, a mode register 14, a plurality of banks 15, an address buffer and bank selector 16, a plurality of column address counters 17, a color register 18, a mask register 19, and an input/output (I/O) buffer 20. The clock buffer 11 receives a clock signal CLK and a clock enable signal CKE supplied from an external controller (not shown) such as a CPU or the like. The clock buffer 11 outputs a clock signal CLK to circuits 13 to 20 in response to a clock enable signal CKE high. Moreover, the clock buffer 11 controls the output of the clock signal CLK in response to a clock enable signal CKE low.

The command decoder 12 receives various control signals /CS, /RAS, /CAS, /WE, and DSF supplied from the external controller and generates an internal control signal in accordance with a combination of these signals. The internal control signal is supplied to each control signal latch circuit 13 and the mode register 14. Each control signal latch circuit 13 latches the internal control signal in accordance with the clock signal CLK and outputs the signal to each bank 15. Each bank 15 includes a plurality of memory cell arrays and peripheral circuits of the memory cell arrays.

The address buffer and bank selector 16, with a register function, latches address signals A0 to A8, and a bank selection signal A9. The address signals A0 to A8 correspond to row address signals and column address signals. The external controller alternately supplies both address signals to bank selector 16. The selector 16 supplies the latched row address signals to each bank 15 and the latched column address signals to each column address counter 17. The row address signals comprise 9-bit data and the column address signals comprise 8-bit data (that is, A0 to A7). The bank selection signal A9 is supplied to the mode register 14, each column address counter 17, the color register 18, and the mask register 19.

The I/O buffer 60 provided with a register function, receives 32-bit input data values DQ0 to DQ31 supplied from the external controller and supplies the input data values DQ0 to DQ31 to an input/output (I/O) terminal 15a of each bank 15. Moreover, the I/O buffer 60 receives data supplied from each bank 15 and outputs the data as output data values DQ0 to DQ31. In the block write mode, mask data is supplied to the mask register 19 or the I/O terminal 15a of each bank 15 through the I/O buffer 60 as input signals DQ0 to DQ31. The mask register 19, as shown in FIG. 7, stores the mask data of the bits corresponding to the input signals DQ0 to DQ31. This mask data is supplied to each bank 15. Moreover, in the block write mode, color data serving as write data is stored in the color register 18 through the I/O buffer 60 as the input signals DQ0 to DQ31. This color data is supplied to each bank 15.

The mode register 14 selects one operation mode out of a plurality of preset operation modes in accordance with the internal control signal and supplies a selected mode setting signal to each column address counter 17. Each column address counter 17 automatically and quickly generates column address signals to be continuously supplied in accordance with the reference column address signals supplied from the external controller and outputs the signals to each bank 15.

Figure 8:
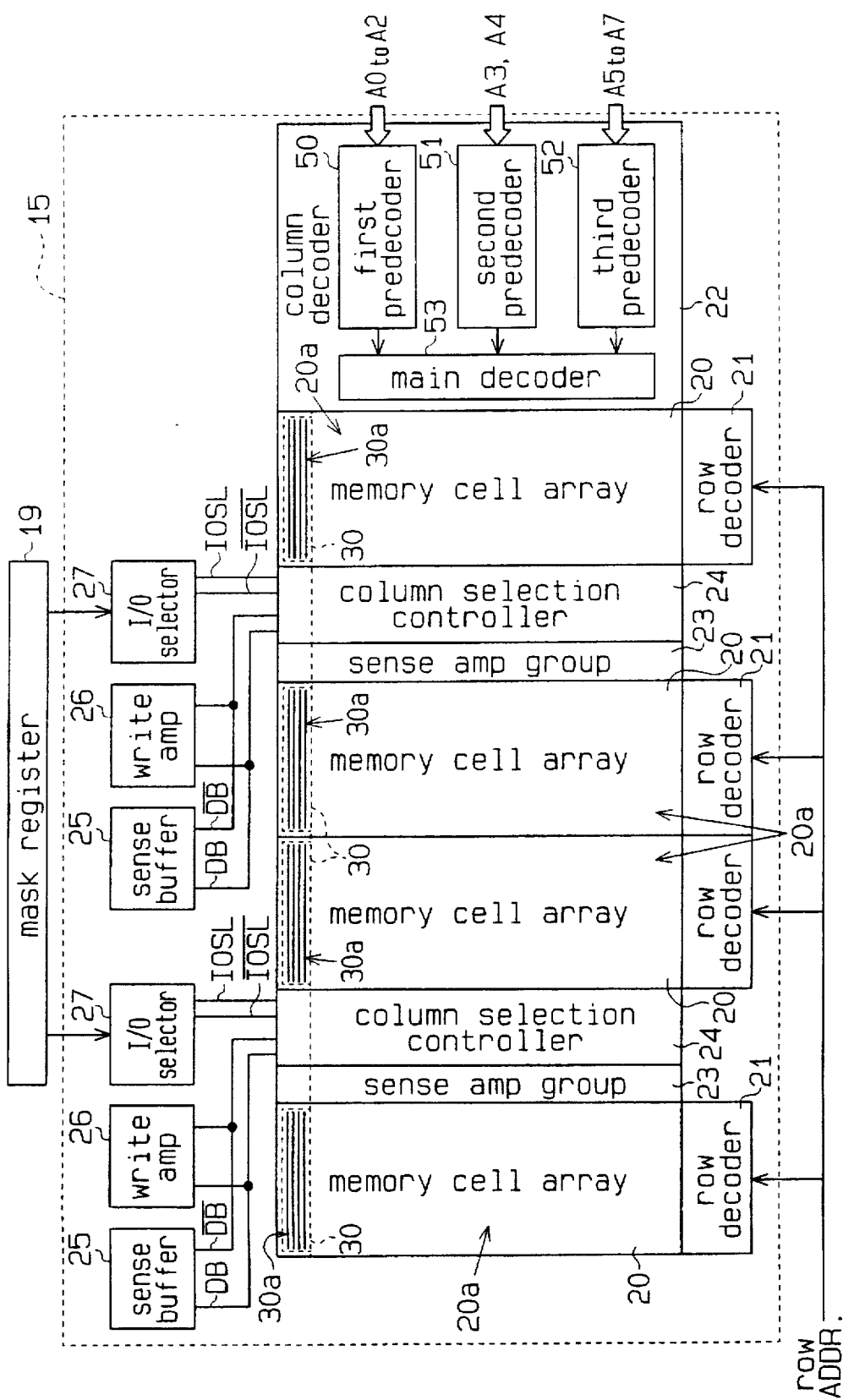

FIG. 8 is a diagram showing a bank 15. Each bank 15 is provided with a plurality of memory cell arrays 20 (in this case, four memory cell arrays) arranged in a line. Each memory cell array 20 is provided with a normal region 20a in which a group of memory cells corresponding to a plurality of normal columns is arranged and a redundant region 30 in which a group of memory cells corresponding to a plurality of redundant columns is arranged. Each memory cell array 20 is connected to a row decoder 21. Each row decoder 21 selects a specific word line in each memory cell array 20 in accordance with row address signals supplied from the address buffer 16. One column decoder 22 is arranged at one side of a memory cell array of a plurality of memory cell arrays 20 and the column decoder 22 is connected to each memory cell array 20 in common. The column decoder 22 supplies common column selection signals CSL to each memory cell array 20 in accordance with column address signals A0 to A7 supplied from the column address counter 17. The detail of the column decoder 22 is described below.

A sense-amplifier group 23 is arranged between two adjacent memory cell arrays 20. The sense amplifier group 23 includes a plurality of sense amplifiers arranged so as to be common to each column of each memory cell array 20 adjacent at the both sides of the group 23. Any one of adjacent memory cell arrays 20 is selected by the row decoder 21 and a plurality of bit lines of the selected memory cell array 20 are connected to each sense amplifier.

Figure 9:
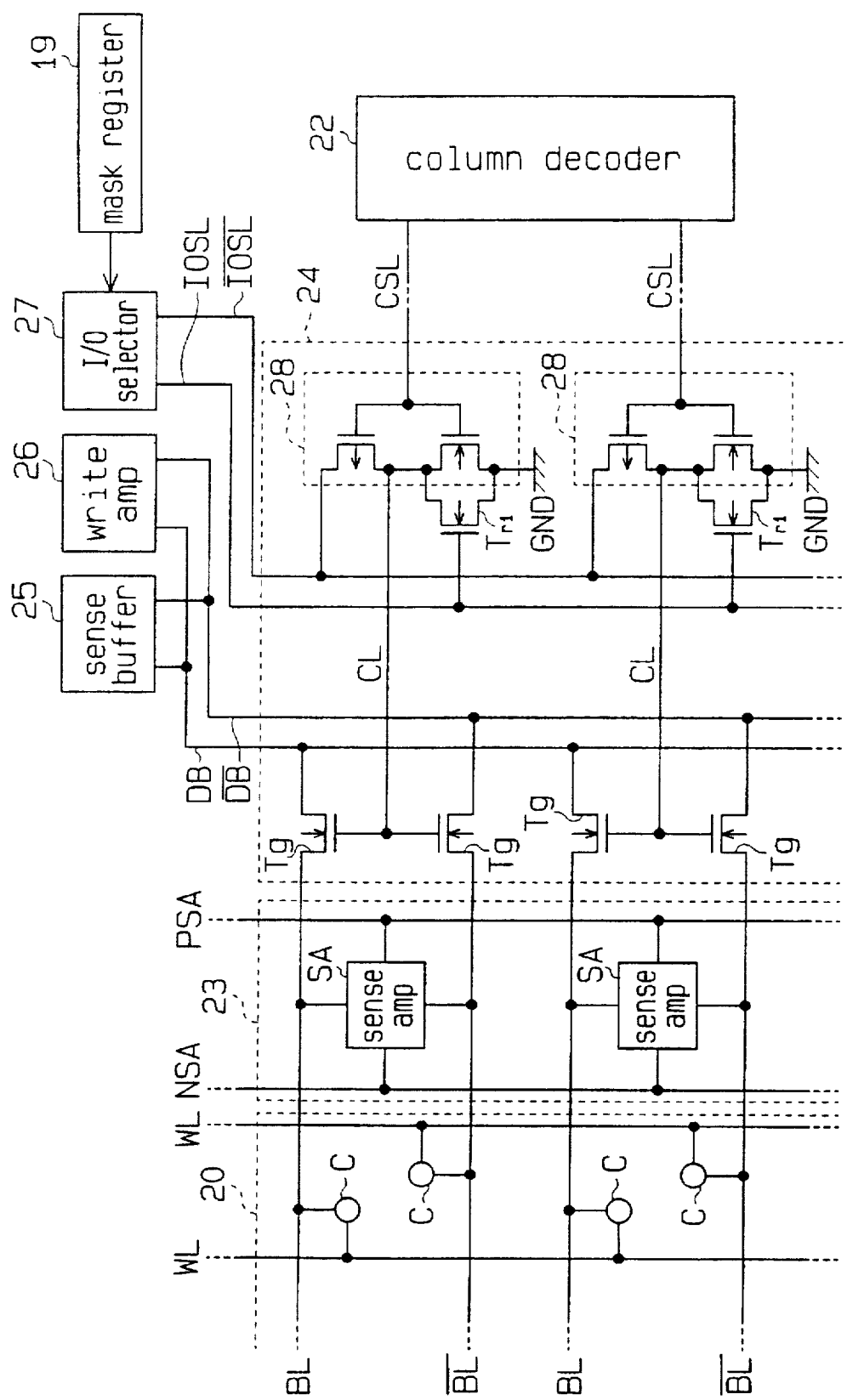

Moreover, a column selection controller 24 is arranged between two adjacent memory cell arrays 20 next to the sense amplifier group 23. FIG. 9 is a circuit diagram showing the column selection controller 24. A data bus pair (DB./DB) is arranged in the controller 24. The data bus pair (DB./DB) is connected to a sense buffer 25 and a write amplifier 26 each of which is connected to the I/O terminal 15a of the bank 15. An I/O selection line pair (IOSL./IOSL) is arranged in the controller 24 and the line pair (IOSL./IOSL) is connected to an I/O selector 27. The I/O selector 27 receives mask data supplied from the mask register 19 and applies H-level voltage to one of the I/O selection line pair (IOSL./IOSL) and L-level voltage to the other of the pair.

The column decoder 22 supplies column selection signals CSL, corresponding to each column in each memory cell array 20, to the column selection controller 24. The controller 24 is provided with a plurality of inverter circuits 28 responsive to each column selection signal CSL. The inverter circuit 28 is provided with P- and N-channel MOS transistors. The P-channel MOS transistor has a source connected to an I/O selection line /IOSL. The N-channel MOS transistor has a source connected to a ground GND. The N-channel MOS transistor of each inverter circuit 28 is connected to an N-channel MOS transistor Tr1 in parallel. The transistor Tr1 has a gate connected to the I/O selection line IOSL.

Moreover, the controller 24 has a plurality of column gates Tg connected between the data bus pair (DB./DB) and each bit line pair (BL./BL). Each column gate Tg comprises an N-channel MOS transistor and each transistor has a gate for inputting an output signal CL from each inverter circuit 28.

Normal Read Operation

Figure 10:
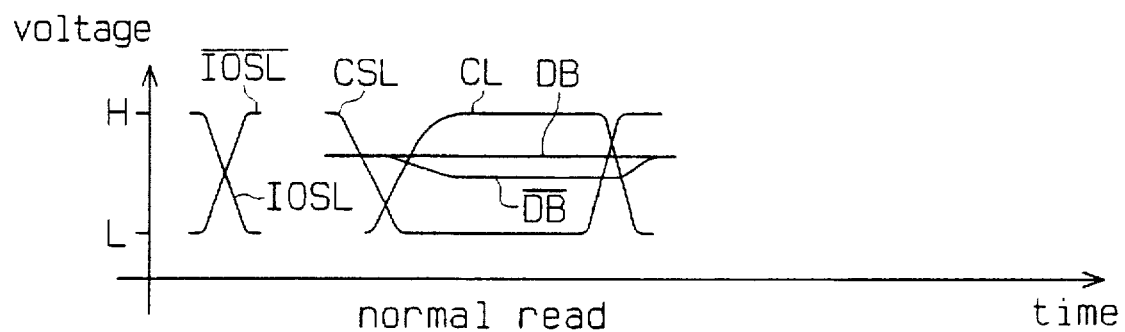

In the normal read mode, cell data stored in a memory cell C associated with one column selected in accordance with column address signals and a word line selected in accordance with row address signals is read through the data bus pair (DB./DB). In the read mode, mask data is not stored in the mask register 19. Then, as shown in FIG. 10, the I/O selector 27 applies L-level voltage to the I/O selection line IOSL and H-level voltage to the /IOSL. With this voltage application, each inverter circuit 28 is activated. When the column selection signals CSL in which any one is L-level is supplied to each inverter circuit 28 from the column decoder 22 under the above state, any one of the inverter circuits 28 supplies an output signal CL high to the column gate Tg. Thereby, the column gate Tg is turned on, any one of columns is selected, and the bit line pair (BL./BL) of the selected column is connected to the data bus pair (DB./DB). At this time, the row decoder 21 selects a word line WL in accordance with row address signals. Thus, cell data is read out to the bit line pair (BL./BL) from the memory cell C associated with the selected word line WL. The cell data is output as read data DQ through the sense buffer 25, the I/O terminal 15a of the bank 15, and the I/O buffer 60.

Normal Write Operation

Similarly to the case of the read mode, one memory cell C is selected in accordance with column address signals and row address signals. The write amplifier 26 amplifies write data DQ supplied from the external controller through the I/O buffer 60 and the I/O terminal 15a of the bank 15. The sense amplifier SA associated with the selected memory cell C further amplifies the amplified write data DQ supplied to the bit line pair (BL./BL) through the data bus pair (DB./DB) and the column gate Tg. With this operation, the write data DQ is written in the selected memory cell C.

Block Write Operation According to Write-Per-Bit Method

Figure 11:
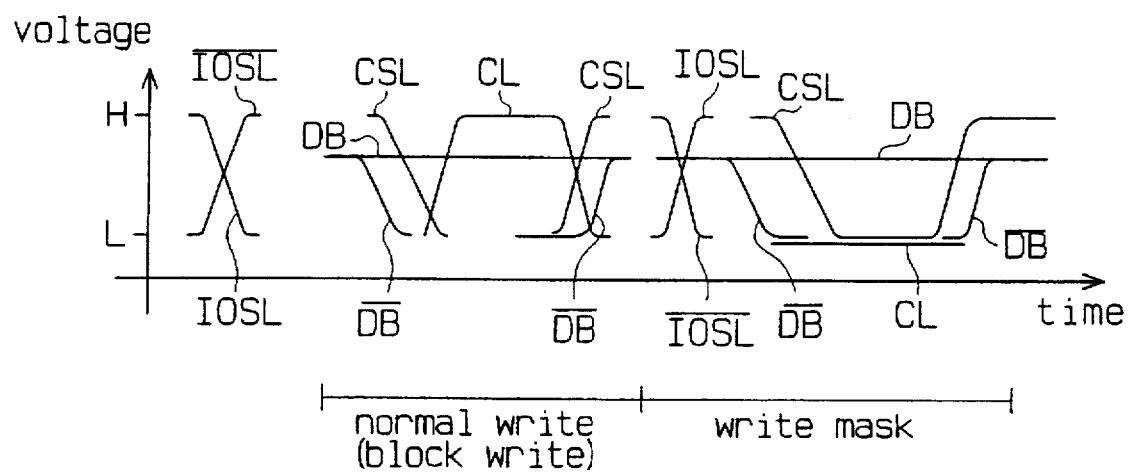

The command decoder 12 sets the block write mode in accordance with each control signal supplied from the external controller. Then, the mask register 19 stores the input data DQ supplied from the external controller through the I/O buffer 60 as mask data. The mask data includes the data of "1" for designating block write and the data of "0" for designating write masking. When the mask data is "1", the I/O selector 27 applies L-level voltage to the I/O selection line IOSL and H-level voltage to the I/O selection line /IOSL, in order to activate each inverter circuit 28, as shown in FIG. 11. The column address decoder 22 generates column selection signals CSL with low potential level, respectively, corresponding to eight consecutive columns in accordance with column address signals of the remaining five bits, except for the low-order three bits. The inverter circuit 28, corresponding to eight consecutive columns, outputs an output signal CL high in response to a column selection signals CSL low. As a result, the column gates Tr of eight columns are turned on. In this case, write data is supplied to the data bus pair (DBJ/DB) from the write amplifier 26. Therefore, the same data is written in each memory cell C associated with the eight selected columns and the selected word line WL.

When the mask data is "0", the I/O selector 27 applies H-level voltage to the I/O selection line IOSL and L-level voltage to the I/O selection line /IOSL in order to deactivate each inverter circuit 28, as shown in FIG. 11. Then, the transistor Tr1 is turned on and each inverter circuit 28 outputs an output signal CL low. As a result, all columns are set to a non-selective state and data write is inhibited. Thus, write masking is performed. Therefore, it is possible to selectively perform write masking and block writing of the data supplied to each I/O terminal in every memory cell 20, in accordance with the mask data stored in the mask register 19. Moreover, it is possible to perform block write of eight bits by one data bus pair (DBJ/DB). This makes it possible to reduce the data bus pair (DBJ/DB), that is, to reduce a circuit area. In the case of write masking, the column gate Tg associated with each column is turned off and each sense amplifier SA is disconnected from the data bus pair (DBJ/DB). This prevents current from flowing to the sense amplifier SA from the write amplifier 26. Therefore, power consumption can be decreased.

The redundant function of an SGRAM is described below. A plurality of redundant columns 30a (in this case, four columns) are provided in a redundant region 30 of each memory cell array 20. If presence of a defective cell in the normal region 20a is confirmed in the operation test of a memory, the normal column associated with the defective cell is changed to a redundant column in the redundant region 30. The column decoder 22 compares input column address signals A0 to A7 with preset redundant address signals and changes the access to a normal column to the access to a redundant column when both addresses coincide with each other.

The column address decoder 22 is provided with a first predecoder 50 for receiving low-order three-bit address signals A0 to A2 of eight-bit column address signals A0 to A7, a second predecoder 51 for receiving middle-order two-bit address signals A3 and A4, and a third predecoder 52 for receiving high-order three-bit address signals A5 to A7. The column decoder 22 is further provided with a main decoder 53 for receiving eight predecode signals from the first predecoder 50, four predecode signals from the second predecoder 51, and eight predecode signals from the third predecoder 52. The main decoder 53 outputs 256 (=8×4×8) column selection signals obtained by combining predecode signals supplied from the first to third predecoders 50 to 52 to each memory cell array 20.

Figure 12:
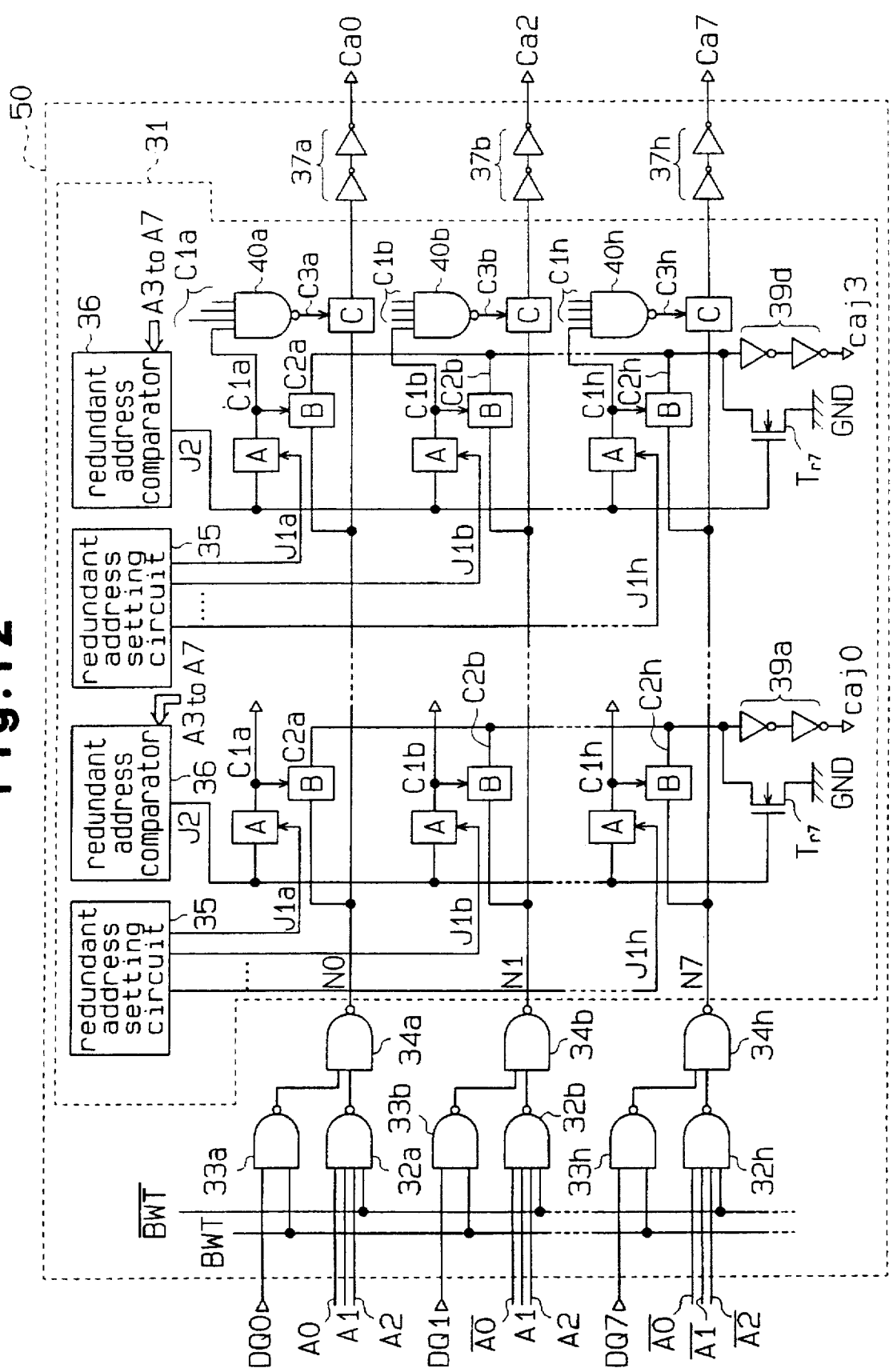

FIG. 12 is a block diagram showing the first predecoder 50. The first predecoder 50 is provided with a redundant selector 31. The first predecoder 50 receives a block write signal (BWT./BWT) supplied from the command decoder 12. In the block write operation, the signal BWT is H-level and the signal /BWT is L-level. In the write and read operations, the signal BWT is L-level and the signal /BWT is H-level. The first predecoder 50 is provided with eight first 4-input NAND circuits 32a to 32h (32c to 32g are not shown), eight second 2-input NAND circuits 33a to 33h (33c to 33g are not shown), and eight third 2-input NAND circuits 34a to 34h (34c to 34g are not shown).

Each of the first NAND circuits 32a to 32h has three input terminals for receiving eight types of signals A0, A1, and A2 to /A0, /A1, and /A2 corresponding to low-order three-bit address signals A0 to A3 and one input terminal for receiving the block write signal /BWT. Therefore, in the write and read operations, any one of the NAND circuits 32a to 32h supplies an output signal high. In the block write operation, all the NAND circuits 32a to 32h supply an output signal high.

Each of the second NAND circuits 33a to 33h has a first input terminal for receiving the block write signal BWT and a second input terminal for receiving the input data values DQ0 to DQ7 serving as column masking data. Therefore, in the write and read operations, all the NAND circuits 33a to 33h supply an output signal high. In the block write operation, the NAND circuits 33a to 33h supply output signals obtained by inverting the logic of the input data values DQ0 to DQ7.

Each of the third NAND circuits 34a to 34h has a first input terminal for receiving output signals from the first NAND circuits 32a to 32h and a second input terminal for receiving output signals from the second NAND circuits 33a to 33h. Therefore, in the write and read operations, any one of the NAND circuits 34a to 34h supplies normal decode signals N0 to N7 high. In the block write operation, the NAND circuits 34a to 34h supply normal decode signals N0 to N7 with the same potential level as the input data values DQ0 to DQ7.

The redundant selector 31 is provided with eight third switching circuits C for selectively controlling the passage of the normal decode signals N0 to N7 supplied from the respective third NAND circuits 34a to 34h. Each third switching circuit C allows the normal decode signals N0 to N7 to pass unless a redundant address is previously set. Then, the normal decode signals N0 to N7 are supplied as predecode signals Ca0 to Ca7 through two-stage inverter circuits 37a to 37h connected to the third switching circuits C, respectively.

The redundant selector 31 is able to perform redundant operations by four-system circuits with the same structure. In this case, only one system is described below in order to avoid redundant description. The redundant selector 31 is provided with a redundant address setting circuit 35 and a redundant address comparator 36. The redundant address setting circuit 35 sets low-order three-bit redundant address signals among eight-bit normal column addresses by selectively disconnecting each of three fuses corresponding to low-order three bits in which a defective cell is detected. When the low-order three-bit redundant address is previously set, the setting circuit 35 supplies eight first redundant signals J1a to J1h any one of which is L-level. When the redundant address is not previously set, the circuit 35 supplies the first redundant signals J1a to J1h, all of which are H-level.

The redundant address comparator 36 sets high-order 5-bit redundant address signals among eight-bit normal column addresses by selectively disconnecting each of five fuses corresponding to high-order five bits in which a defective cell is detected. The comparator 36 compares high-order five bits A3 to A7 among the eight-bit normal column address signals A0 to A7 with high-order five bits among preset eight-bit redundant column address signals. When a column address signal coincides with a preset redundant address in high-order five bits, a second redundant signal J2 low is supplied. When the both addresses do not coincide with each other, a second redundant signal J2 high is supplied.

The redundant selector 31 is provided with eight first switching circuits A. Each switching circuit A has a control terminal for receiving the first redundant signals J1a to J1h supplied from the setting circuit 35 and an input terminal for receiving the second redundant signal J2 supplied from the comparator 36. In this case, a specific signal selected from the signals J1a to J1h is expressed as a signal J1x. Other signals and circuits are similarly expressed by using x. A first switching circuit A supplies the second redundant signal J2 as an output signal C1x in response to an first redundant signal J1x low. The first switching circuit A supplies an output signal C1x high in response to an first redundant signal J1x high.

The redundant selector 31 is further provided with eight second switching circuits B. Each second switching circuit B has a control terminal for receiving output signals C1a to C1h from each first switching circuit A and an input terminal for receiving the normal decode signals N0 to N7 from each of the third NAND circuits 34a to 34h. The second switching circuit B supplies a corresponding signal Nx among the normal decode signals N0 to N7 as an output signal C2x in response to an output signal C1x low. The second switching circuit B sets its own out terminal to a high-impedance state in response to an output signal C1x high.

The redundant selector 31 is provided with two-stage inverter circuits 39a to 39d responsive to output signals C2a to C2h output from each second switching circuit B for each of four systems. Each of the inverter circuits 39a to 39d has an input terminal connected to each ground GND through N-channel MOS transistors Tr7 and an output terminal for supplying redundant column selection signals caj0 to caj3. When any one of the redundant column selection signals caj0 to caj3 becomes H-level, a redundant column of any system in a redundant region 30 is selected. Each transistor Tr7 has a gate for inputting the second redundant signal J2.

The redundant selector 31 is further provided with eight NAND circuits 40a to 40h. The NAND circuit 40a has four input terminals for receiving output signals C1a of each first switching circuit A of four systems. Each of the remaining NAND circuits 40b to 40h also has four input terminals for receiving output signals C1b to C1h of each first switching circuit A of four systems. The NAND circuit 40a supplies an output signal high when any one of four output signals C1a is L-level and supplies an output signal low when all the output signals C1a are H-level.

Each third switch circuit C has a control terminal for receiving the normal decode signals N0 to N7 from the third NAND circuits 34a to 34h and an input terminal for receiving output signals C3a to C3h from the NAND circuits 40a to 40h. The third switching circuit C supplies a normal decode signal Nx as a predecode signal Cax in response to an output signal C3x low. The third switching circuit C supplies an output signal low in response to an output signal C3x high and controlling the passage of the normal decode signal Nx. Thereby, a predecode signal Cax low is supplied from a two-stage inverter circuit 37x. The main decoder 53 supplies a column selection signal CSL high to each memory cell array 20 in accordance with the predecode signal Cax low. As a result, selection of columns is regulated.

The operation of the first predecoder 50 will be described below when no redundant address is previously set. Each redundant address setting circuit 35 of four systems supplies eight first redundant signals J1a to J1h high. In response to these signals, each first switching circuit A supplies eight output signals C1a to C1h high. Each second switching circuit B sets its own output terminal to a high-impedance state in response to the signals C1a to C1h high. Each address comparator 36 of four systems supplies a second redundant signal J2 high and the transistor Tr7 of each system is turned on in response to the signal J2 high. With this operation, a signal low is supplied to the inverter circuits 39a to 39d of each system and the redundant column selection signals caj0 to caj3 become L-level. As a result, any one of the redundant columns of four system is not selected. Each of the NAND circuits 40a to 40h supplies output signals C3a to C3h low in response to output signals C1a to C1h high from the first switching circuit A of each system. Thereby, each third switching circuit C is set to a state for allowing the normal decode signals N0 to N7 to pass.

In the above state, a block write signal BWT low and a signal /BWT high are supplied to perform the normal read and write operations. Each of the second NAND circuits 33a to 33h supplies an output signal high independently of the level of the input data values DQ0 to DO7. Each of the first NAND circuits 32a to 32h supplies output signals in which any one is L-level and the others are H-level in accordance with inputs of low-order three-bit address signals A0, A1, A2 to /A0, /A1, and /A2. Thus, each of the third NAND circuits 34a to 34h supplies the normal decode signals N0 to N7 in which any one is H-level and others are L-level. The normal decode signals N0 to N7 pass through each third switching circuit C and are supplied through the respective inverter circuits 37a to 37b to the main decoder 53 as predecode signals Ca0 to Ca7 in which any one is H-level and the others are L-level. Therefore, the first predecoder 50 can output predecode signals in which one normal column is selected in the normal write and read operations. The main decoder 53 supplies column selection signals CSL, in which any one is L-level and the others are H-level, to the memory cell array 20, in accordance with predecode signals output from the first to third predecoders 50 to 53. Thereby, one column in the memory cell array 20 is selected.

The operation of the first predecoder 50, when a redundant address is previously set in a certain system, will be described below. The redundant address setting circuit 35 supplies eight first redundant signals J1a to J1h in which any one is L-level and the others are H-level. When high-order five bits in a redundant address coincide with high-order five bits A3 to A5 in column address signals, the redundant address comparator 36 supplies a second redundant signal J2 low. One of the first switching circuits A allows the second redundant signal J2 low to pass in response to the first redundant signal J1x low and supplies the signal J2 low as an output signal C1x low. One of the second switching circuits B supplies a signal Nx among the normal decode signals N0 to N7 to an inverter circuit 39x in response to the output signal C1x low. Therefore, when a preset redundant address coincides with a column address, one of the normal decode signals N0 to N7 corresponding to the redundant address is supplied to the main decoder 53 as a redundant column selection signal cajx. A NAND circuit 40x receiving the output signal C1x low supplies an output signal C3x high and one of the third switching circuits C supplies an output signal fixed to L level in response to the output signal C3x high. Thus, a signal NOx supplied as the redundant column selection signal cajx is not allowed to pass through the third switching circuit C but an output signal low showing non-selection of a normal column is supplied. Therefore, when a normal column address coincides with a redundant address, it is possible to change the access from a column including a defective cell to a redundant column.

Now, the block write operation will be described below. Block write signals BWT high and /BWT low are supplied to the first predecoder 50. Each of the first NAND circuits 32a to 32h supplies an output signal high, independently of input column address signals. At this time, it is assumed that input data signals DQ0 to DQ7, all of which are H-level, are supplied to the second NAND circuits 33a to 33h. In this case, column masking is not performed during the block write operation but each of the second NAND circuits 33a to 33h supplies an output signal high. Each of the NAND circuits 34a to 34h supplies the normal decode signals N0 to N7, all of which are H-level.

Unless any redundant address is previously set, the normal decode signals N0 to N7 high pass through each third switching circuit C and they are supplied as predecode signals Ca0 to Ca7, all of which are H-level. Therefore, it is possible to output predecode signals for selecting consecutive eight columns in the block write operation. Thus, eight consecutive column selection signals CSL become L-level among 256 column selection signals CSL to be supplied to memory cell arrays from the main decoder 53. Then, sequential switching of high-order 5-bit addresses to be supplied to the first to third predecoders 51 to 53 makes it possible to sequentially write the same data in every eight columns.

To perform the write masking according to the column mask method, an input data signal corresponding to a column to be write-masked becomes L-level among input data values DQ0 to DQ7. A third NAND circuit 34x supplies an L-level normal decode signal Nx corresponding to L-level input data. Thus, an L-level normal decode signal Nx is supplied as a predecode signal. Therefore, by controlling the potential levels of the input data values DQ0 to DQ7 in the block write operation, it is possible to supply the predecode signals Ca0 to Ca7 for performing write masking according to the column masking method.

When a redundant address is preset in the block write operation and high-order five bits of the normal column address signals A3 to A7 coincide with high-order five bits of the redundant address in the same operation as described above, any one of the normal decode signals N0 to N7 is supplied as the redundant column selection signal cajx. Then, a predecode signal corresponding to a normal decode signal supplied as a redundant column is fixed to L level. Thus, it is possible to switch the access from one column including a defective cell to one redundant column in accordance with a redundant address in the block write operation. In other words, it is not necessary to locate eight redundant columns in order to switch the access from a normal column to a redundant column in block write. Therefore, it is also possible to perform redundant operations for block write by using four redundant columns located to perform redundant operation of four systems. This makes it possible to decrease the number of redundant columns, while preventing the number of redundant systems from decreasing and resultingly reduce the area of region 30 in an SGRAM having a block write function.

Figure 13:
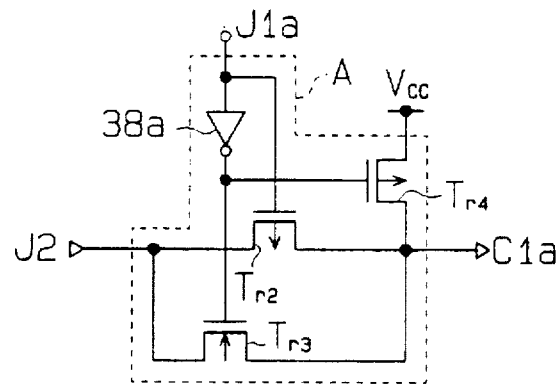

FIG. 13 is a schematic diagram showing the first switching circuit A. The switching circuit A is provided with an inverter circuit 38a, first and second P-channel MOS transistors Tr2 and Tr4, and an N-channel MOS transistor Tr3. The inverter circuit 38a has an input terminal for receiving the first redundant signal J1a and an output terminal. The P-channel MOS transistor Tr2 has a gate for receiving the first redundant signal J1a, a source for receiving the second redundant signal J2, and a drain for supplying the output signal C1a. The N-channel MOS transistor Tr3 is connected to the transistor Tr2 in parallel and has a gate for receiving an output signal from the inverter circuit 38a. The P-channel MOS transistor Tr4 has a gate for receiving an output signal from the inverter circuit 38a, a source connected to a high-potential power supply Vcc, and a drain connected to the drain of the transistor Tr2. When the first redundant signal is L-level, the transistors Tr2 and Tr3 are turned on and the transistor Tr4 is turned off. With this operation, the second redundant signal J2 is supplied as the output signal C1a. When the first redundant signal is H-level, the transistors Tr2 and Tr3 are turned off and the transistor Tr4 is turned on. Thereby, the output signal C1a is fixed to H level.

Figure 14:
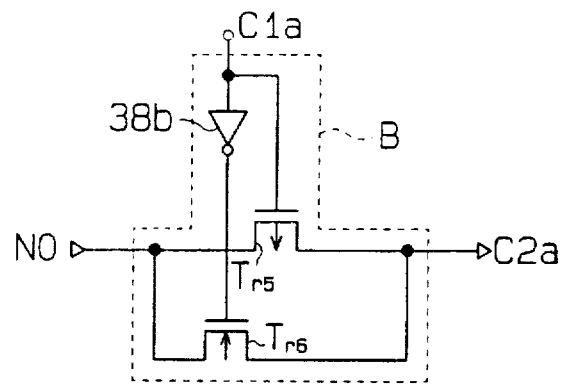

FIG. 14 is a schematic diagram showing the second switching circuit B. The switching circuit B is provided with an inverter circuit 38b, a P-channel MOS transistor Tr5, and an N-channel MOS transistor Tr6. The inverter circuit 38b has an input terminal for receiving the output signal C1a from the first switching circuit A and an output terminal. The P-channel MOS transistor Tr5 has a gate for receiving the output signal C1a, a source for receiving the normal decode signal N0 from the third NAND circuit 34a, and a drain for supplying the output signal C2a. The N-channel MOS transistor Tr6 is connected to the transistor Tr5 in parallel and has a gate for receiving an output signal from the inverter circuit 38b. When the output signal C1a is L-level, the transistors Tr5 and Tr6 are turned on, and the normal decode signal N0 is allowed to pass and supplied as the output signal C2a. When the output signal C1a is H-level, the transistors Tr5 and Tr6 are turned off and the drain of the transistor Tr5 is set to a high-impedance state.

Figure 15:
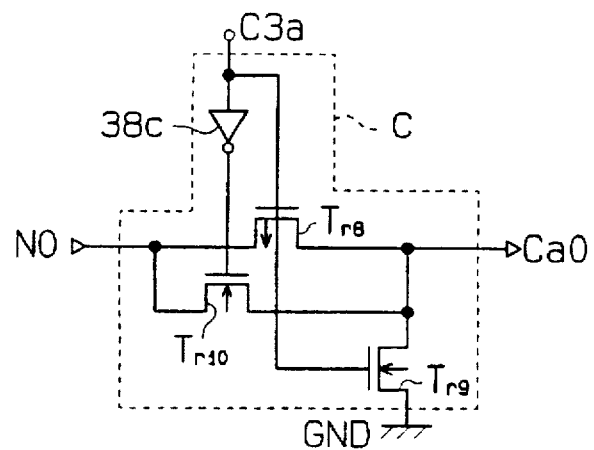

FIG. 15 is a schematic diagram showing the third switching circuit C. The third switching circuit C is provided with an inverter circuit 38c, a P-channel MOS transistor Tr8, and first and second N-channel MOS transistors Tr9 and Tr10. The inverter circuit 38c has an input terminal for receiving the output signal C3a from the NAND circuit 40a and an output terminal. The P-channel MOS transistor Tr8 has a gate for receiving the output signal C3a, a source for receiving the normal decode signal N0 from the third NAND circuit 34a, and a drain for supplying the output signal Ca0. The first N-channel MOS transistor Tr9 has a gate for receiving the output signal C3a, a drain connected to the drain of the P-channel MOS transistor Tr8, and a source connected to a ground GND. The second N-channel MOS transistor Tr10 is connected to the transistor Tr8 in parallel and has a gate for receiving an output signal from the inverter circuit 38c. When the output signal C3a is L-level, the transistors Tr8 and Tr10 are turned on and the transistor Tr9 is turned off. With this operation, the normal decode signals N0 to N7 are supplied as the predecode signals Ca0 to Ca7. When the output signals C3a to C3h are H-level, the transistors Tr8 and Tr10 are turned off and the transistor Tr9 is turned on. Thereby, the output signal Ca0 is fixed to L level and a predecode signal Ca0 low is supplied from the inverter circuit 37a.

Although only one embodiment of the present invention has been described herein, it should be apparent to those skilled in the art that the present invention may be embodied in many other specific forms without departing from the spirit or scope of the invention. Therefore, the present examples and embodiment are to be considered as illustrative and not restrictive and the invention is not to be limited to the details given herein, but may be modified within the scope of the appended claims.

What is claimed is:

1. A semiconductor memory device which is operable in an operation mode selected from a read mode, a normal write mode and a block write mode, said memory device comprising:

a memory cell array having a plurality of pairs of bit lines, a plurality of word lines and a plurality of memory cells provided at intersections of said bit lines and said word lines, each pair of said bit lines and the memory cells associated with each bit line pair forming one of a plurality of columns defined in said memory cell array;

a pair of data lines; and a column selection controller, supplied with a group of column selection signals, for selectively connecting and disconnecting said pair of data lines to and from said plurality of pairs of bit lines, wherein in response to the group of column selection signals with a first signal output pattern for use in said normal write mode or said read mode, said column selection controller selects one of said plurality of columns to connect said pair of data lines to a pair of bit lines associated with the selected column, and wherein in response to the group of column selection signals with a second signal output pattern for use in said block write mode, said column selection controller selects at least two of said plurality of columns to connect said pair of data lines to the bit line pairs associated with a column block as a group of the selected columns.

2. The semiconductor memory device according to claim 1, wherein said column selection controller is supplied with a write mask signal being used for invalidating at least one of the selected columns of said column block; and wherein said column selection controller selectively invalidates said group of column selection signals with said second signal output pattern in response to said write mask signal.

3. The semiconductor memory device according to claim 2, wherein said memory cell array includes a plurality of sense amplifiers coupled between said plurality of pairs of bit lines, respectively.

4. The semiconductor memory device according to claim 2, wherein said column selection controller includes:

a plurality of inverters receiving said group of column selection signals, each of said inverters having series-connected P-channel MOS transistor and N-channel MOS transistor, each P-channel MOS transistor having a source; and a plurality of second N-channel MOS transistors, each of which has a gate and is connected in parallel to said series connected N-channel MOS transistor of a respective associated inverter, and wherein said semiconductor memory device further comprises an I/O selector, responsive to said write mask signal, for generating a pair of complementary signals to be supplied to said column selection controller, one of said complementary signals being provided to the sources of the P-channel MOS transistors of said inverters while the other of said complementary signals being provided to the gates of said second N-channel MOS transistors.

5. The semiconductor memory device according to claim 1, wherein said columns are normal columns and wherein said memory cell array also includes a plurality of redundant columns;

wherein the semiconductor memory device further comprises:

a column decoder, coupled to said column selection controller, for decoding externally supplied normal column address signals to generate said group of column selection signals, said column decoder including a predecoder and a main decoder coupled to said predecoder, said predecoder being supplied with normal column address signals to selectively generate either a first group of predecode signals or a second group of predecode signals in accordance with an operation mode of the semiconductor memory device, said first group of predecode signals being used for selecting only one column from said plurality of normal columns when the read mode or normal write mode is selected, said second group of predecode signals being used for selecting a specific group of normal columns as said column block from said plurality of columns when the block write mode is selected, said predecoder including a redundant column selector, wherein when the address indicated by said normal column address signals differs from a preset redundant address, said redundant column selector allows all of said predecode signals to be supplied to said main decoder, wherein when the address indicated by said normal column address signals is coincident with said preset redundant address, said redundant column selector prevents a part of said predecode signals from being supplied to said main decoder and provides redundant column selection signals to said main decoder; and wherein said main decoder generates said group of column selection signals based on the signals output from said predecoder, and selects one of said plurality of redundant columns in said memory cell array with reference to said redundant column selection signals.

6. The semiconductor memory device according to claim 5, wherein when the block write mode is selected, said predecoder is supplied with a write mask signal being used for invalidating at least one of the second group of predecode signals; and wherein said predecoder selectively invalidates said second group of predecode signals in response to a write mask signal.

7. A semiconductor memory device having a block write mode, said memory device comprising:

a memory cell array having a plurality of pairs of bit lines, a plurality of word lines and a plurality of memory cells provided at intersections of said bit lines and said word lines;

a pair of data lines; and a column selection controller, supplied with column selection signals, for selectively disconnecting said pair of data lines from said plurality of pairs of bit lines in response to a mask control signal during said block write mode.

* * * * *